United States Patent [19]

Parikh et al.

[11] Patent Number: 4,739,882
[45] Date of Patent: Apr. 26, 1988

[54] CONTAINER HAVING DISPOSABLE LINERS

[75] Inventors: Mihir Parikh, San Jose; Anthony C. Bonora, Menlo Park; W. George Faraco, Saratoga; Barney H. Huang, Sunnyvale, all of Calif.

[73] Assignee: Asyst Technologies, Milpitas, Calif.

[21] Appl. No.: 829,447

[22] Filed: Feb. 13, 1986

[51] Int. Cl.[4] .............................................. B65D 1/04
[52] U.S. Cl. ..................... 206/454; 206/334; 206/455; 220/404; 220/408; 141/98; 414/217; 414/292
[58] Field of Search ............... 206/454, 455, 328, 334; 220/315, 324, 326, 403, 404, 408, 410; 414/292, 217; 141/98; 118/500

[56] References Cited

U.S. PATENT DOCUMENTS

| | | | |
|---|---|---|---|
| 3,066,824 | 12/1962 | Bostrom | 220/315 |
| 3,383,009 | 5/1968 | Weikert | 220/324 |
| 4,043,451 | 8/1977 | Johnson | 206/334 |
| 4,135,625 | 1/1979 | Merrill | 206/445 |
| 4,319,679 | 3/1982 | Gustaffson | 220/408 |
| 4,412,771 | 11/1983 | Gerlach et al. | 414/217 |
| 4,487,331 | 12/1984 | Hawker | 220/408 |
| 4,532,970 | 8/1985 | Tullis et al. | 414/217 X |
| 4,534,389 | 8/1985 | Tullis | 141/98 |
| 4,557,382 | 12/1985 | Johnson | 206/334 |
| 4,582,219 | 4/1986 | Mortensen et al. | 220/326 |
| 4,588,086 | 5/1986 | Coe | 206/334 |
| 4,616,683 | 10/1986 | Tullis et al. | 141/98 |

FOREIGN PATENT DOCUMENTS 138473 4/1985 European Pat. Off. .

Primary Examiner—George E. Lowrance
Assistant Examiner—Brenda J. Ehrhardt
Attorney, Agent, or Firm—Fliesler, Dubb, Meyer & Lovejoy

[57] ABSTRACT

The present invention is a transportable container for storing articles and maintaining a clean article, such as semiconductor wafers, clean. The container provides a box which defines an interior space for containing the articles. The box includes a box top and box base which supports the box top and includes a box door for opening and closing the container. The box door provide a region for supporting the articles in the interior space. A liner is insertable into the interior space and surrounds the region. The box door is retractable from the box space. The articles in the region are retractable with the box door.

29 Claims, 9 Drawing Sheets

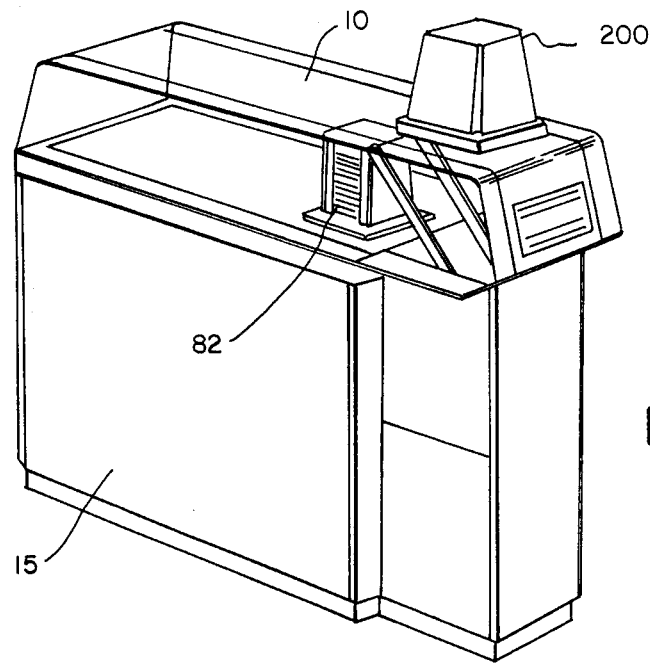
FIG.—1
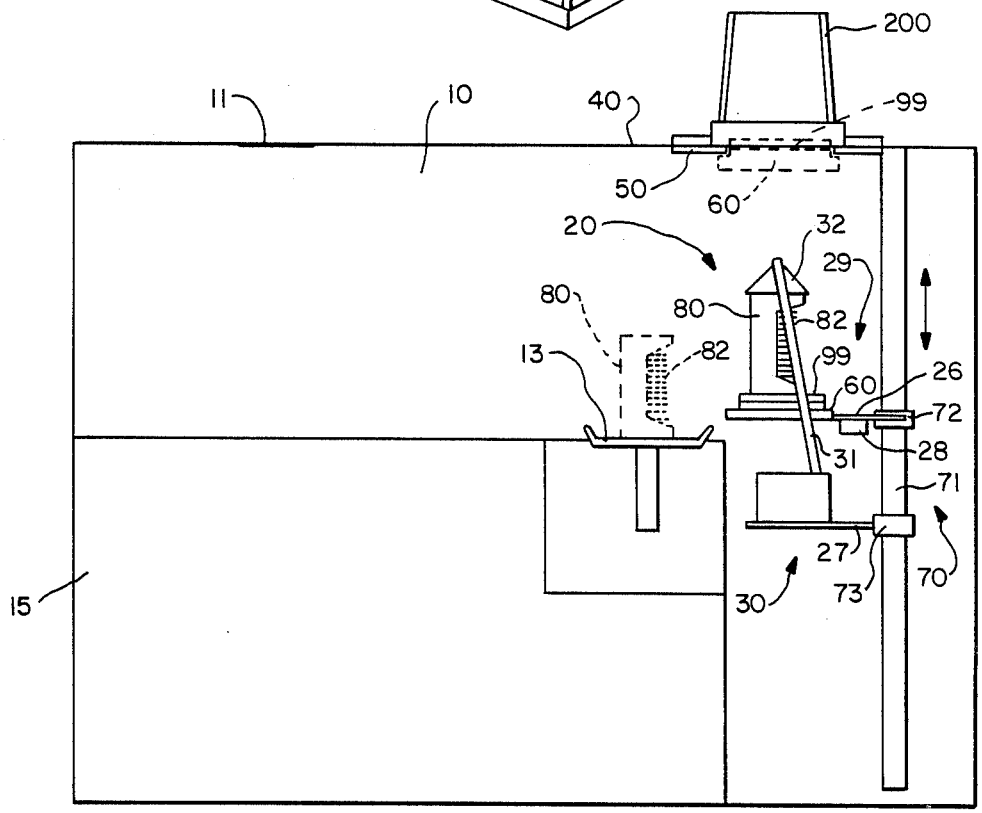
FIG.—2

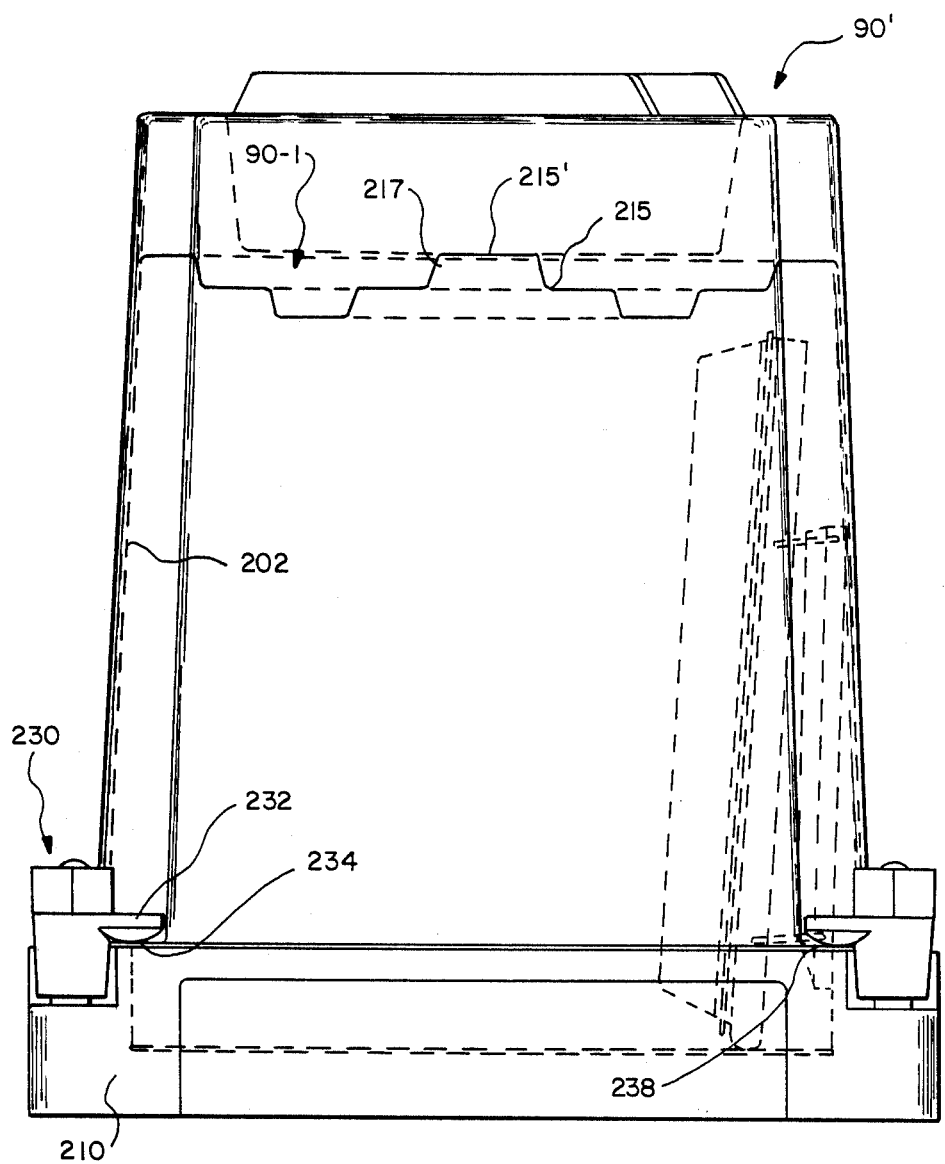
FIG. —4

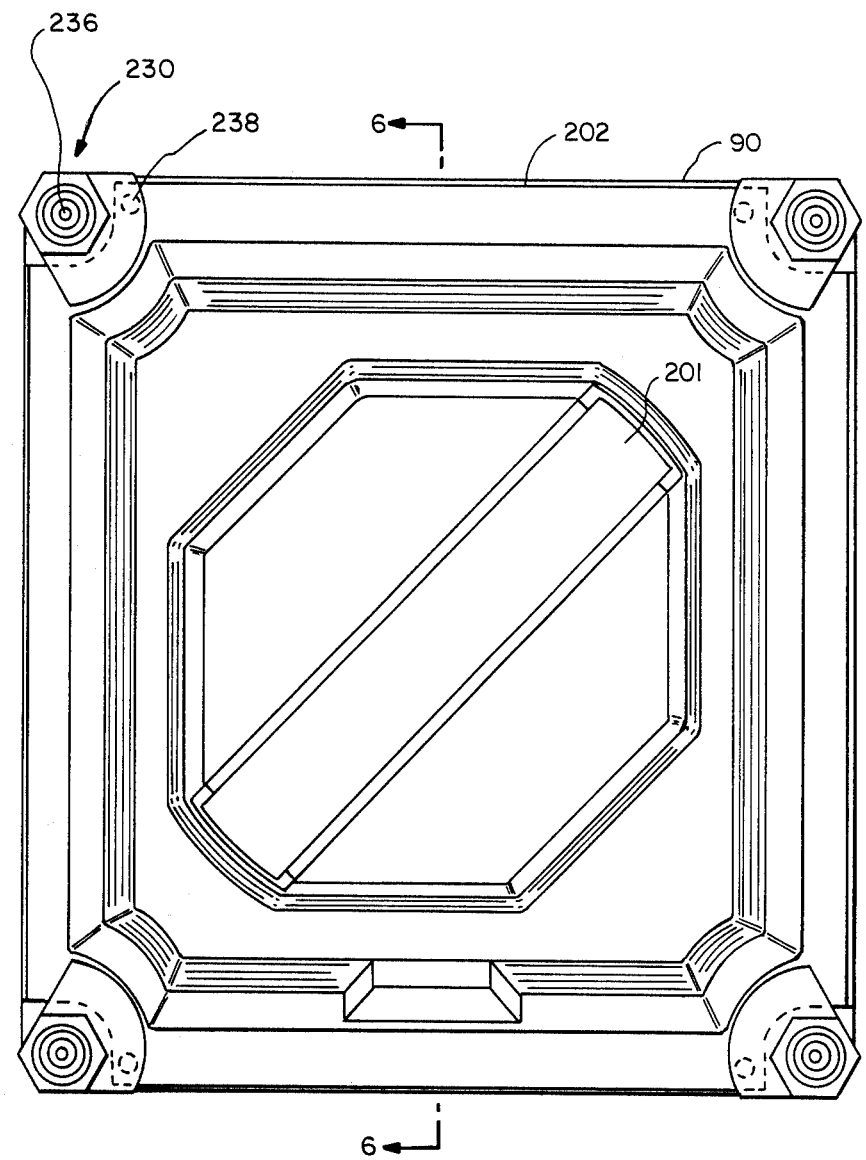
FIG.—5

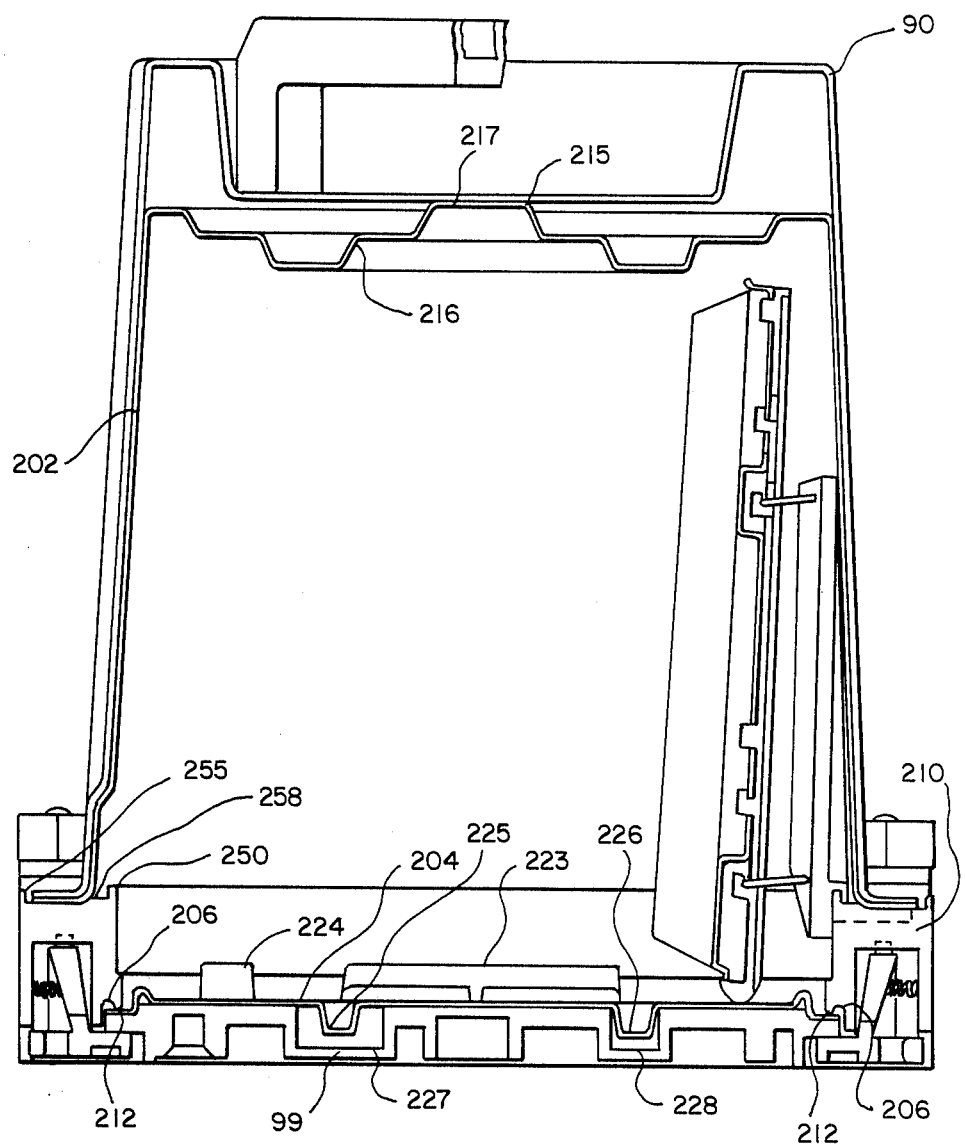
FIG. —6

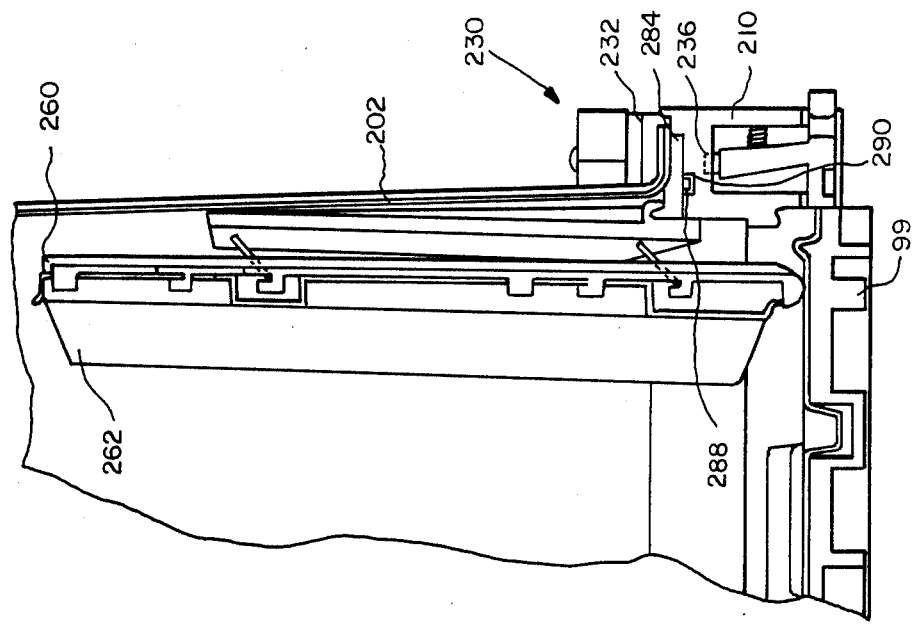
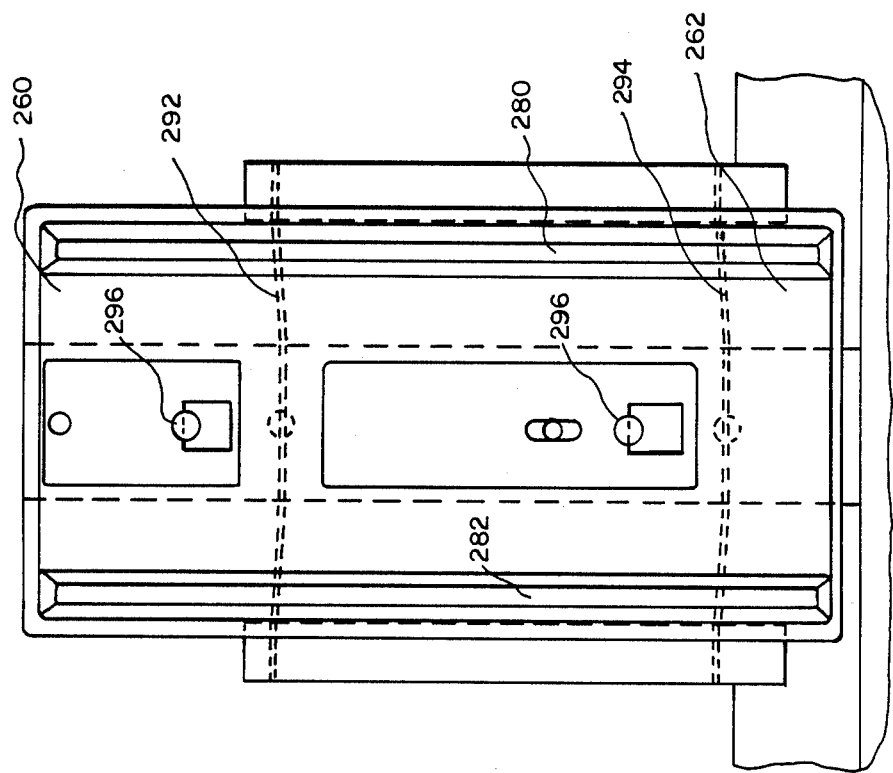

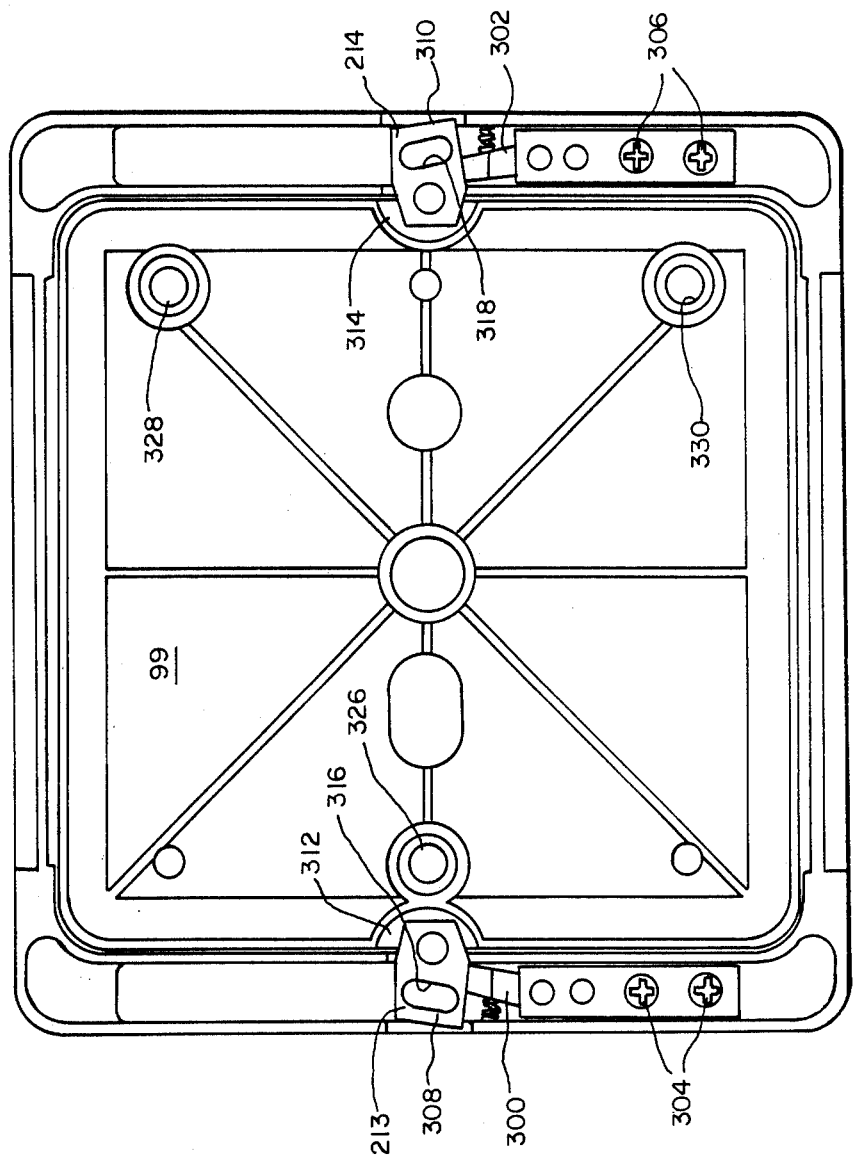
FIG.—9

CONTAINER HAVING DISPOSABLE LINERS

CROSS REFERENCE TO RELATED APPLICATIONS

SEALED STANDARD INTERFACE APPARATUS, Inventors: George Allen Maney, Andrew William O'Sullivan, W. George Faraco, Ser. No. 635,384, Filed: July 30, 1984.

INTELLIGENT WAFER CARRIER, Inventors: George Allen Maney, Anthony Charles Bonora, Mihir Parikh, Ser. No. 686,444, Filed: Dec. 24, 1984.

DOOR ACTIVATED RETAINER, Inventors: George Allen Maney, W. George Faraco, Mihir Parikh, Ser. No. 686,443, Filed: Dec. 24, 1984.

LONG ARM MANIPULATOR FOR STANDARD MECHANICAL INTERFACE APPARATUS, Inventors: Anthony Charles Bonora, Andrew William O'Sullivan, Ser. No. 769,709, Filed: Aug. 26, 1985.

SHORT ARM MANIPULATOR FOR STANDARD MECHANICAL INTERFACE APPARATUS, Inventors: Anthony Charles Bonora, Ser. No. 769,850, Filed: Aug. 26, 1985.

BACKGROUND OF INVENTION

The present invention relates to standardized mechanical interface (SMIF) systems for reducing particle contamination and more particularly to transportable containers apparatus employing disposable liners and suitable for use in semiconductor processing equipment.

A standardized mechanical interface (SMIF) has been proposed by the Hewlett-Packard Company as disclosed in U.S. Pat. Nos. 4,532,970 and 4,534,389. The purpose of the SMIF system is to reduce particle contamination by significantly reducing particle fluxes onto wafers. This end is accomplished by mechanically ensuring that during transportation, storage and processing of the wafers, the gaseous media (such as air or nitrogen) surrounding the wafers is essentially stationary relative to the wafers and by ensuring that particles from the ambient environment do not enter the immediate wafer environment.

The proposed SMIF system consists of two parts: (1) a controlled environment including a clean process equipment canopy surrounding the wafer-handling mechanism of each processing machine, and (2) a small, clean box having a quiet internal environment for carrying wafers from processing machine to processing machine.

Systems of the above type are concerned with particle sizes which range from below 0.1 micrometers to above 200 micrometers. Particles with these sizes can be very damaging in semiconductor processing because of the small geometries employed in fabricating semiconductor devices. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries which today in research and development labs approach 0.1 micrometer and below. In the future, geometries will become smaller and smaller and hence smaller and smaller contamination particles become of interest.

In typical processing environments today, "clean rooms" are established in which through filtering and other techniques, attempts are made to remove particles having geometries greater than 0.03 micrometer and above. There is a need, however, to improve the processing environment. In clean room wafers and other semiconductor processing articles are exposed to the full clean room environment. Since different people, different types of equipment and materials are also present in the clean room environment, the clean room cannot be maintained as particle free as desired. It is virtually impossible to maintain clean rooms free of particles of a 0.1 micrometer size and below.

For this reason, systems such as the SMIF system have come under consideration. The proposed SMIF system, however, has some deficiencies. When SMIF boxes becomes contaminated, it is very difficult to remove small contaminant particles since the force of attraction of small particles to surfaces of the equipment is very high. When small particles become attached to a surface such as a SMIF box, they are not effectively removed by filtration techniques. Circulating and filtering air or other gas within a box does not readily remove the contamination particles which are attracted and held in contact with surfaces. However, whenever an object such as a SMIF box is disturbed, by bumping for example, many small particles are freed from the surface and find their way as contaminants onto any semiconductor or other article which is present in the bos. While scrubbing and washing techniques have been developed for removing small particles from equipment and surfaces, these processes tend to be cumbersome and furthermore are not entirely effective.

In accordance with the above background, there is a need for an improved system which can be standardized and which is effective for reducing contamination.

SUMMARY OF THE INVENTION

The present invention is a transportable container which provides a clean environment for articles to be processed. The container is used particularly in connection with semiconductor processing equipment which also provides a clean environment. The container is also used to store the articles before and after processing. The container is adapted to receive a holder for holding one or more of the articles, such as semiconductor wafers, to be processed. A rigid base is provided for supporting the holder. A disposable liner is adapted to surround the holder and the one or more articles to be processed. The rigid base and holder are retractable from the disposable liner into the clean environment of the processing equipment, for example under a processing equipment canopy, whereby the articles can be processed without contamination.

In a preferred embodiment, the transportable container includes a box defining an interior space for containing the articles. The box includes a box top and a rigid box base for supporting the box top. The box base includes a box door for opening and closing the box. The box base provides a region for supporting the holder which holds articles. The container includes a liner insertable into the box and surrounding the interior space above the base region. The box door is retractable from the box base to permit the articles in a holder to be removed from the box and processed in a controlled clean environment of the processing equipment. After processing, the articles can be reinserted from the clean environment of the processing equipment into the clean environment of the box. In this manner, the articles never are removed from a clean environment.

In a preferred embodiment, the liner comprises a top liner which is made of a semi-rigid material which maintains a concave shape and surrounds the holder independently of any mechanical support. The top liner is located between the box top and the box base.

In another preferred embodiment, the liner includes a base liner which is adapted to fit on the surface of the box door. The base liner has a sealing lip around its perimeter for exerting a force between the base and the box door for encouraging a dust-tight seal therebetween. And the top liner includes a compression means for exerting a force between the box top and box base.

In an alternate embodiment, the liner is a thin, flexible plastic liner which requires mechanical support to be held in a tent shape.

The present invention achieves the objective of providing a removable, and discardable liner for a transportable container usable in conjunction with semi-conductor processing equipment to provide a clean environment for semi-conductor wafers and other materials.

Additional objects and features of the invention will appear from the following description in which the preferred embodiments of the invention have been set forth in detail in conjunction with the drawings.

BRIEF DESCRIPTION OF THE DRAWINGS

FIG. 1 illustrates a perspective view of a standard mechanical interface (SMIF) apparatus with processing equipment, utilizing the transportable container of the present invention.

FIG. 2 depicts a schematic representation of a side view of the SMIF apparatus and processing equipment of FIG. 1.

FIG. 4 is a side elevational view of the transportable container in accordance with this invention.

FIG. 5 is a top view of the transportable container of FIG. 4.

FIG. 6 is a cross-sectional view of the transportable container of FIG. 5 in the open position.

FIG. 7 is an enlarged front plan view of the tongue assembly.

FIG. 8 is a cross-sectional view of the tongue in the open position.

FIG. 9 is a bottom view of the box base and box door.

DETAILED DESCRIPTION OF THE PREFERRED EMBODIMENTS

Figure 3:
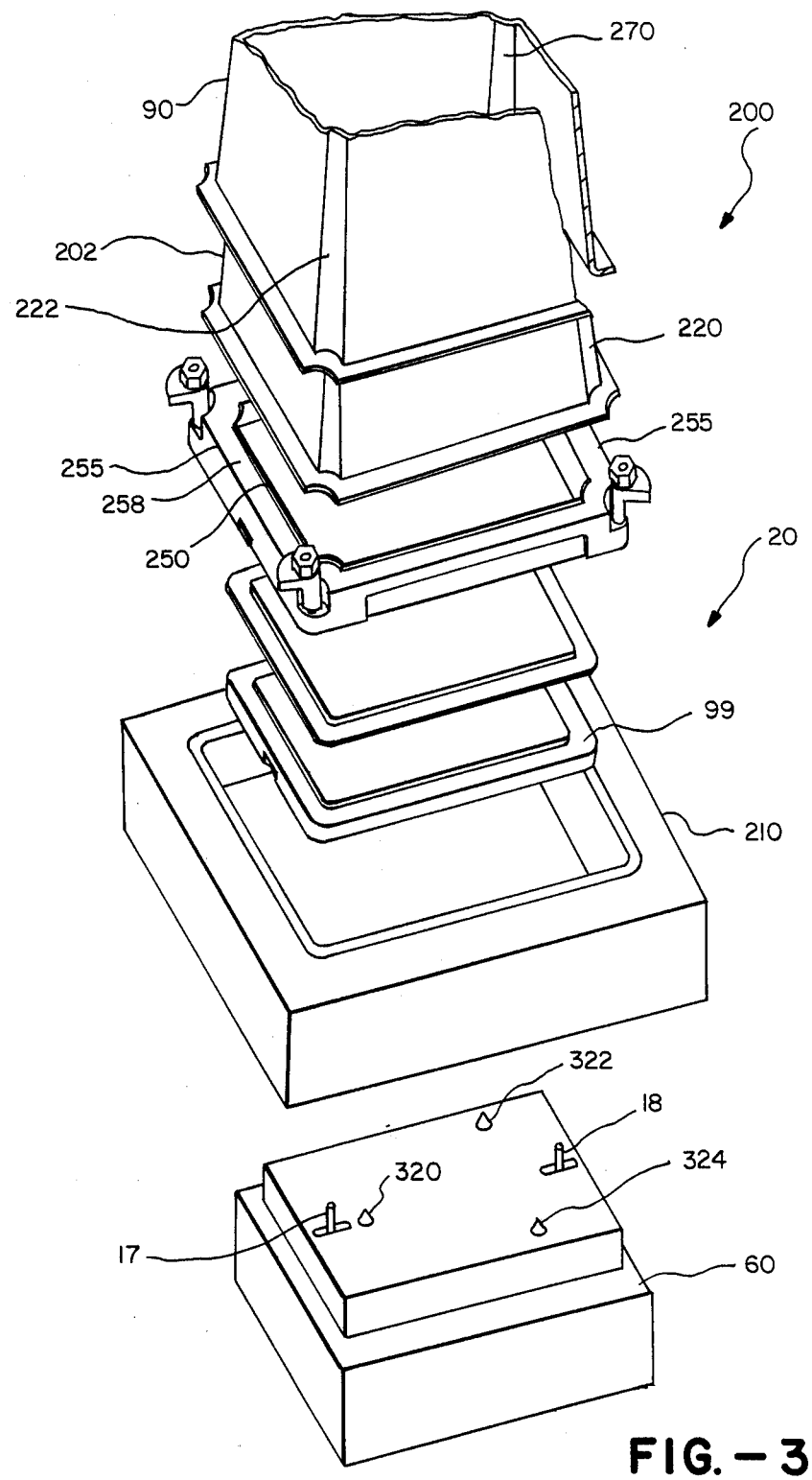
FIG. 3 is an exploded perspective view of the port assembly in conjunction with the present invention.

In FIG. 1, a canopy 10 is an easily removable shield that covers the wafer-handling mechanisms of the processing equipment 15. Equipment 15 is a photoresist applicator, mask aligner, inspection station, or any similar processing equipment. The canopy 10 is constructed of transparent plastic, such as acrylic or Lexan to facilitate inspection and/or maintenance within the canopy 10. The canopy 10 encloses the handling mechanisms of the processing equipment 15 and a holer 80, such as a wafer cassette holding wafers 82. A clean or otherwise controlled environment is maintained under canopy 10 by filters and other means (not shown) within processing equipment. Therefore the equipment 15 need not be installed in a clean room.

FIG. 2 shows further details of the FIG. 1 apparatus. A box top 90 is mounted on an horizontal surface 40 of the canopy 10 by means of a port plate 50. A port assembly 20 further includes a port door 60 and an elevator mechanism 70 that transports the cassette 80, containing the integrated circuit wafers 82, from a container 200 into the processing equipment region beneath the canopy 10. In FIG. 2, a port door 60 and a box door 99 are shown both in the open position (solid lines) and in the closed position by broken lines.

A mover assembly 29 includes a platform 26, a shaft engagement means 72, and a drive motor 28. The platform 26, extending from the elevator assembly 70, carries the port door 60, the box door 99, and the cassette 80 in a vertical direction. The platform 26 is attached by engagement means 72 to a vertical guide 71 of elevator assembly 70. The mover assembly 29 and elevator assembly 70 operate to move the port door 60 and the box door 99 in the verticle direction, whereby the holder 80 is inserted into and retracted from the interior region of the container 200.

Typically, guide 71 includes a lead screw (not shown) and motor 28 drives a gear (not shown) which engages the lead screw for driving the platform 26 up and down. When platform 26 is driven to the closed position, the port door 60 closes the port opening in the canopy 10.

In a similar manner, a manipulator assembly 30 is fastened to a platform 27 which has an engagement means 73 for engaging the vertical shaft assembly 71. Manipulator 30 includes a manipulator arm 31 and an engagement head 32 adapted to engage the cassette 80. By vertical operation of the platforms 26 and 27 and operation of the manipulator 30, the cassette 80 is moved from its position on the box door 99 (shown by solid lines) to a position on the equipment station 13 (shown by broken lines).

With particular reference to FIG. 3, there is shown a schematic exploded perspective view of the transportable container 200 in accordance with this invention. The container 200 includes a box 90 including a box top 90 and a box base 210. The box top 90 defines an interior box space 270 for containing articles to be processed. The articles comprise wafers 82 which are held by a holder 80 in the form of a cassette. The box top 90 is supported by the rigid box base 210. The box base 210 includes a box door 99 for opening and closing the container 200.

A box top liner 202 is insertable into the box top 99 and is positioned between the box base 210 and the box top 90. The top liner 202 sits on the base 210. The top liner 202 is made from a non-contaminating material such as a thermoplastic, examples of which are vinyl and acrylic. Thermoplastics can be made by well-known techniques into relatively thin transparent films of 1 mil or thinner or of relatively thick, more dimensionally stable, dimensions of for example 25 mils. In any embodiment, such thermoplastic films are manufactured by processes which result in a low number of very small contaminant particles. Furthermore, the contaminants which do exist are thermoplastic contaminants which are a known entity.

The top liner 202 as well as the other liners which will be discussed more fully below, are all disposable liners. Typically, a liner is destroyed after several uses. It is expected that liner would last 1 week to 3 weeks under expected processing conditions. Although the liner environment is as clean as possible, contaminants are present. The contaminants collect on the surface of the liner and eventually cause the liner to become dirty and not useful in the processing environment. By replacing the liner, container 200 is restored to its original "clean" state without the need to replace the entire container itself.

When the box top 90 is loaded prior to processing with the cassette 80 and new wafers 82, any old liner previously in the box may be discarded and a new liner is first inserted. Accordingly, any contaminants which may exist on the box top 90 resulting from previous uses in many different process locations, are shielded from the wafers 82 and the cassette 80 by the top liner 202.

With respect to the embodiment of FIGS. 4, 5, and 6, the top liner 202 is made of a semi-rigid material which maintains a concave shape, a tent shape, surrounding the articles independent of any external mechanical support from the box top 90. The liner 202 fits snugly within box top 90 and is slideably removable therefrom. The liner 202 includes compression means 215 on the top surface 215'. The compression means is formed by a recessed bellows 216 surrounding a top compression nipple 217 and two bottom nipples 219 and 221. When the container 200 is in the closed position, with cassette 80 inside the container 200, the compression means 215 and particularly, the nipple 217 contact a recessed portion 90-1 of the box top 90 at surface 215'. The two bottom nipples 219 and 221 contact the cassette 80 with uniform pressure. The compression means 215 thus creates a uniform compressive force between the box top 90 and the base 210 which encourages a dust-tight seal between the box top 90 and the base 210. By dust-tight seal, it is meant that particles of 0.1 micron are not permitted to enter the seal. Of course, a gas-tight seal would also work, but the cost of achieving same is prohibitive and the improvement in overall results using this invention would be minimal.

To enhance the slideable connection of the top liner 202 with a box top 90, each are provided with registration means 220 and 222, respectively as seen in FIG. 3. The registration means ensures proper fit of the tent liner 202 with the box top 90. In the embodiment shown in FIGS. 3-7, the registration means 220 and 222 comprise grooves made in each of the corners of the box top 90 and tent liner 202 which compatibly slide and mate with one another. In this way a proper fit of the top liner and box is always assured.

The base 210 is rigid and made from a metal such as anodized aluminum. As shown with particular reference to FIGS. 4 and 8, the base 210 supports the box top 90 and includes means 230 for securing the box top 90 to the base 210. The means 230 comprises a rotatable head 232 which comprises a cam having a male locking member 234. The means 230 is removably secured to the base 210 by a mounting pin 236. As the head 232 is rotated to the lock position, the male locking member 234 engages a female locking member 238 on the top liner 202.

As mentioned earlier, it is desirable for the box top 90, top liner 202 and base 210 to create a dust-tight seal therebetween. For this purpose, base 210 includes an inner and outer ridge, 250 and 255, respectively as shown with respect to FIGS. 3 and 6. Between the ridges 250 and 255 is defined a floor 258. Adjacent to the inner ridge 250, the floor is sloped defining a sloped edge. The sloped edge extends around the perimeter of the ridge 250.

As can be seen more clearly in FIGS. 5 and 6, the box top 90 and top liner 202 are supported by the floor 258. The securing means 230 secures the box top 90 to the base 210; the compression means 215 exerts a force therebetween such that the sloped edge forms a dust-tight fit with the box top 90, top liner 202 and base 210.

The base 210 includes a means 260 for engaging the holder or cassette 80. In the embodiment shown in FIG. 4, the means 260 comprises a tongue which is movable with respect to the base 210. The tongue 260 includes a tongue liner 262. The operation of the tongue 260 will be explained in further detail with respect to FIGS. 7 and 8.

As shown in FIGS. 4, 5, and 6, a base liner 204 is located between the base 210 and the box door 99. The base liner 204 has a sealing lip 206 around its perimeter which exerts a force between the base 210 and the box door 99 in the closed position for encouraging a dust-tight seal between the base 210 and box door 99. As shown in more detail with respect to FIG. 8, the sealing lip 206 fits snugly against a ridge 212 of the base 210. Since the base liner 204 is of a flexible thermoplastic material, it conforms with the ridge 212 further encouraging a dust-tight seal.

In order to facilitate the cassette 80 to be retractable with the box door 99 and base liner 206, the base liner 206 is provided with cassette support means 223 and 224. The support means 223 and 224 are asymetrical. Therefore the base liner 206 must fit precisely into box door 99. Registration means 225 and 226 on the base liner 206 are provided to mate with registration means 227 and 228 of the box door 99 and assure a proper fit. Thus, when the box door 99 and the base liner 206 are retracted, the cassette 80 continues to rest upon the support means 223 and 224.

In the embodiment shown in FIG. 4, the base 210 has a center opening 211. The center opening 211 is covered by a skirt liner 240. The skirt liner 240 is made of the same material as liners 202 and 204 and is similarly disposable. The skirt liner 240 extends around the perimeter of base liner 204. In combination with liners 202 and 204, the surfaces of the container 200 exposed to the cassette 80 are completely covered. Thus, in order to produce the original "clean" environment, the lines 202, 204 and 240 are simply replaced.

In use the transportable container 200 is carried in the closed position with the articles inside a holder such as the cassette 80 which holds wafers 82. The transportable container 200 is provided with a handle 201 which is affixed to the container 200 as shown in FIG. 5.

No contamination is allowed to enter the interior space 270 where the articles are contained. The combination of the compression means 215 and sealing lip 206 create a dust-tight seal which prevents contamination from entering the interior space 270. Thus the transportable container can be carried in a non-clean environment to an appropriate processing station where it can then be processed in a controlled clean environment without contamination and without having to make the entire room clean.

FIGS. 7 and 8 illustrate the movement of the tongue 260. In the closed position, the tongue 260 having a tongue liner 262 rests upon the base liner 204 and box door 99. As shown in FIG. 8, when the box door 99 and base liner 204 are retracted, the tongue 260 tends to move in the same direction as the box door 99. This movement is enough to allow the cassette 80 with wafers 82 to be released from the tongue liner 262 and retracted with the box door 99.

FIG. 7 shows a front plan view of the tongue 260 and tongue liner 262. The tongue 260 is connected to the base 210 through legs 280 and 282. The legs have feet 284 and 286 (not shown), respectively. Each foot 284 and 286 includes a male member 288 which fits into a compatible mounting slot 290 in the base 210. The tongue 260 is suspended by arms 292 and 294 which are connected to each of the legs 280 and 282. The arms 292 and 294 allow the tongue 260 to move relative to the base 210. A tongue liner 262 is fastened to the tongue 260 by fastening means 296. The tongue liner 262 includes engagement means 298 for engaging the cassette 80.

In the closed position of the container 200, the tongue 260 and tongue liner 262 rest on the box door 99 and base liner 204. When the box door 99 and base liner 204 are retracted, the tongue 260 tends to move with them and in the process, the cassette 80 is released from the engagement means 298 and is thereby retracted with the box door 99 as shown with respect to FIG. 8.

FIG. 9 is a bottom plan view of the box door 99 connected to the base 210. The base 210 includes latch means 213 and 214 which are spring loaded on a lever arms 300 and 302, respectively. The lever arms 300 and 302 are connected to the base 210 by mounting screws 304 and 306 respectively. The lever arms 300 and 302 include heads 308 and 310, respectively. The heads 308 and 310 fit compatibly and are normally urged into detents 312 and 314 of the box door 99. When the container 200 is in the closed position, the box door 99 is sealed against base liner 204 and base 210 with the heads 308 and 310 resting in detents 312 and 314, respectively. The heads 308 and 310 include slots 316 and 318, respectively.

In order to retract the box door 99, the lever arms 300 and 302 must out of their normal position. As shown in FIG. 3, the port door 60 is equipped with actuator pins 17 and 18 which align with the openings 316 and 318, respectively and when appropriate the pins 17 and 18 move the lever arms 300 and 302 aside. The sealing lip compressive force also aids in retracting the box door 99. When the spring loaded latch means 213 and 214 are moved out of their normal position, the compressive force of the sealing lip encourages release of the box door 99.

In order to facilitate alignment of the pins 17 and 18 with the openings 316 and 318, respectively, the port door 60 includes alignment means 320, 322, and 324 which align with alignment means 326, 328, and 330 on the box door 99.

Figure 10:
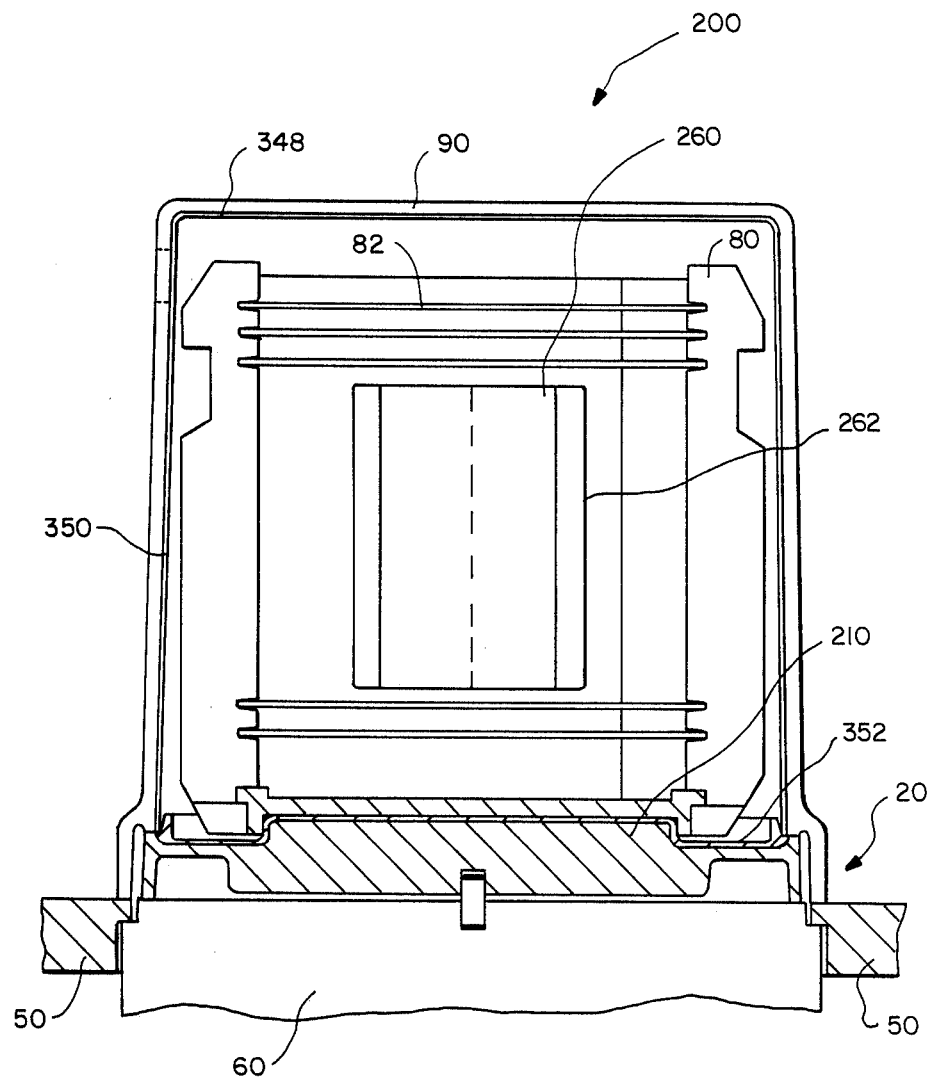
FIG. 10 is a cross-sectional view of an alternate embodiment of a transportable container in accordance with this invention.
Figure 11:
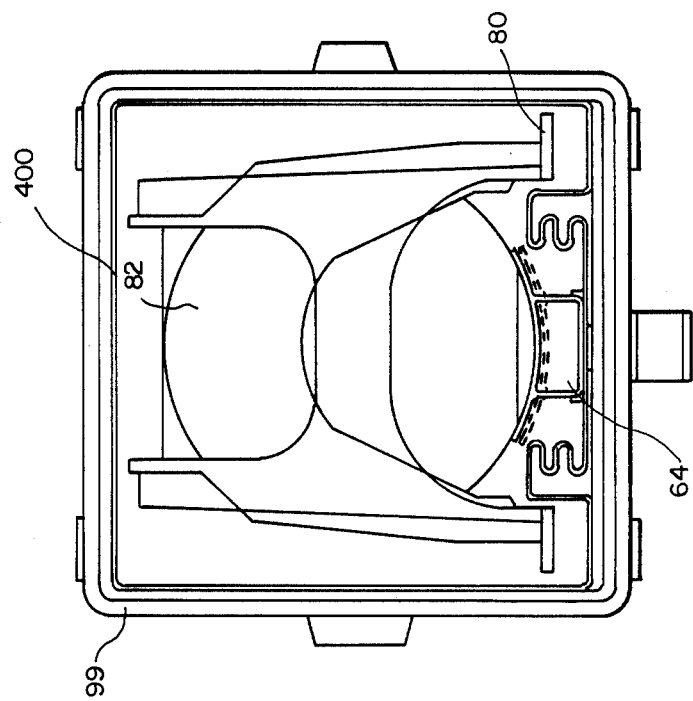
FIG. 11 is a top view of an alternate embodiment of the transportable container in accordance with this invention.

FIG. 10 shows an alternate embodiment of the transportable container 200 in accordance with this invention as well as an alternate embodiment of the port assembly 20. The alternate embodiment includes a box top 90 for containing the articles. A rigid base 210 supports the box top 90 and includes a tongue 260 having a tongue liner 262 for engaging the cassette 80. A liner 348 includes a tent liner portion 350 which surrounds the cassette 80. The tent liner 350 sits on a base liner 352 which is positioned beneath the cassette 80 and rigid base 210. As shown in FIG. 11, the tent liner 350 and the base liner 352 are engageable with each other for sealing to prevent the ingress of contamination into the interior space of the container 200.

Figure 12:
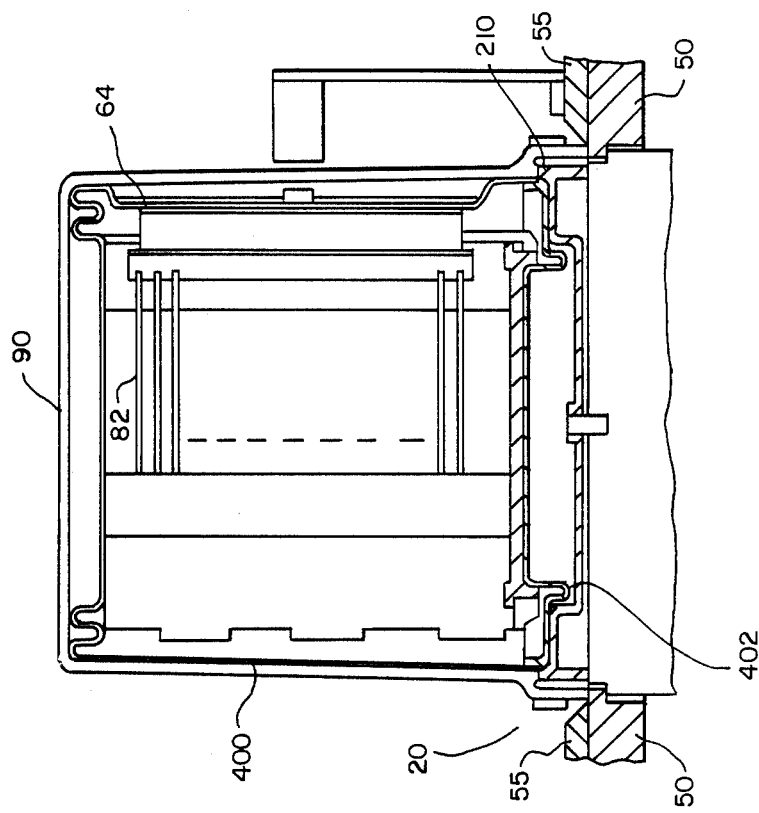
FIG. 12 is a cross-sectional view of the alternate embodiment of FIG. 11.

FIGS. 11 and 12 show another alternate embodiment of a transportable container 200. The port assembly 20 is shown with the cassette 80 fully inserted into the box top 90. Within the box top 90 is a tent liner 400 which is internal to the box top 90 and is external to the cassette 80 and the wafers 82. The tent liner 400 sits upon a base liner 402 which is in turn positioned beneath the cassette 80 and the box base 210. The tent liner 400 and the base liner 402 are each made of a non-contaminating material such as a fluoroplastic. A fluoroplastic is a generic name for polytetrarfluorethylene and its copolymers. One such well known fluoroplastic is teflon. Such fluoroplastics can be made by well-known techniques to be thin transparent films of 1/10th mil or thinner or of relatively thick, more dimensionally stable, dimensions of for example 25 mil. In any embodiment, such fluoroplastic films are manufactured by processes which result in a low number of contaminant particles which are very small. Furthermore, the contaminants which do exist are fluoroplastic contaminants which are a known entity. In general, fluoroplastic contaminants are inert in semiconductor processing except for any physical imperfection that they would cause. In general, fluoroplastic contaminants of a given size are more tolerable then other types of contaminants which result from equipment and semi-conductor materials.

Because the liner 400, and to some extent the liner 402 are soft flexible fluoroplastics, the operation of inserting and retracting the base 210 into and out of the box top 90 permits the plastic liner to shrink or expand in volume thereby minimizing the turbulence of any surrounding gas, such as air, resulting from the insertion and retraction into and out of the box top 90. Because liner 400 is of the thin film which give it the above function, it also means liner 400 requires aditional mechanical support 64 to maintain its tent shape.

In one embodiment, the liners are a electret material which has the property of attracting and holding small charged particles. Such an electret is formed, for example, by the radiation of a fluoroplastic with an appropriate radiation source. Such radiation has the effect of separating positive and negative charges within the fluroplastic thereby forming the electret property to the fluoroplastic.

In another embodiment, the liner is formed of a conductive material. In one example, the fluroplastic liner as previously described is formed within a thin conductive mesh, for example a wire mesh, so as to provide a static shield around the cassette 80 and the wafers 82. For example, a conductive wire mesh having conductors formed of wires of 0.001 diameter gold on 0.005 spacing is satisfactory.

In another embodiment, the liner includes on its inner surface adhesive material. The adhesive surface tends to hold particles which strike the liner.

The liners when formed of a thin fluoroplastic tend to be transparent thereby facilitating observation of the wafers and cassettes through the liner. Of course, the fluroplastic or other material can be rendered translucent or opaque. In one particular embodiment, the liner is doped with a yellow pigment with a purpose of filtering out unwanted ultraviolet light.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A transportable container for storing articles comprising:
    a box defining an interior space for containing the articles;
    the box includes a box top and a box base supporting the box top and includes a box top and includes a box door for closing and opening the container, the box door providing a region for supporting the articles in the interior space;
    a liner insertable into the interior space and shaped to enclose the region;
    wherein the liner is substantially impervious; and
    means for enabling retraction of the box door from the box base, whereby any articles in the region are retractable with the box door.

2. A transportable container for maintaining clean articles in a clean environment, comprising:
    a box for defining an interior space for containing the articles;
    the box includes a box top and a rigid base supporting the box top and includes a box door for opening and closing the container, means for sealing the box top to the box base, and the box door providing a region for supporting the articles;
    a liner insertable into the interior space and shaped to enclose the region;
    wherein the liner is substantially impervious; and
    means for enabling the retraction of the box door from the box base, whereby clean articles are retractable from the container.

3. A transportable container as set forth in claim 2, wherein the liner includes a base liner located on the base and a top liner formed in a concave shape so as to conform to the interior space surrounding the region and the base liner and the top liner forming a seal to prevent contamination from transferring into the interior space.

4. A transportable container as set forth in claim 3, wherein the top and the base liners are engageable with each other.

5. A transportable container as set forth in claim 3, wherein the base has a central opening and a skirt liner extends around the perimeter of the opening and between the base liner and the top liner.

6. A transportable container as set forth in claim 3, wherein the base liner is located between the box base and the box door.

7. A transportable container as set forth in claim 6, wherein the top liner includes compression means for exerting a force between the box top and the base for encouraging a gas tight seal between the box top and the base when the container is in a closed position.

8. A transportable container as set forth in claim 7, wherein the base liner includes a sealing lip for exerting a force between the base and the box door for encouraging a dust-tight seal between the box base and box door when the container is in the closed position.

9. A transportable container as set forth in claim 3 wherein the box base includes means for engaging a holder when the articles are held by the holder.

10. A transportable container as set forth in claim 9 wherein the engagement means comprises a tongue which is movable in response to the retraction of the box door enabling the holder to be retracted with the box door.

11. A transportable container as set forth in claim 10 wherein the tonque includes a tongue liner between the tongue and holder.

12. A transportable container as set forth in claim 3 wherein the box top includes registration means and the top liner includes registration means for mating with the box top registration means for ensuring a proper fit between the box top and the top liner.

13. A transportable container as set forth in claim 3 wherein the box base includes means for sealably securing the box base and box top together.

14. A transportable container for maintaining clean articles to be processed in a clean environment comprising:
    a box defining an interior space for containing the articles;
    the box includes a box top and a box base supporting the box top and includes a box door for opening and closing the container and means for sealing the base to the box top to prevent the entry of contamination into the interior space, the box door providing a region for supporting the articles;
    a top liner insertable into the interior space of the box top and enclosing the region, the means for sealing including compression means on the top liner contacting the box top and a holder inserted into the interior space, the compression means exerting a force on the holder and against the base when the container is closed for encouraging a dust-tight seal between the box top and base to prevent the entry of contamination into the interior space;
    a base liner between the box base and the box door, the base liner having a sealing lip for exerting a force between the box base and the box door for encouraging a dust-tight seal between the box base and the box door to prevent the entry of contamination into the interior space;
    wherein the respective top liner and base liner are substantially impervious; and
    means for enabling the base liner and the box door to be retractable from the base, whereby clean articles can be processed in a controlled, clean environment.

15. A transportable container as set forth in claim 14, wherein the base has a central opening and a skirt liner extends around the perimeter of the opening and between the top and base liners for substantially covering the entire area of the interior space of the container exposed to the holder.

16. A transportable container as set forth in claim 15, wherein each of the liners is separately disposable.

17. A transportable container for containing articles to be processed in processing equipment having a clean environment, said container comprising,
    a holder for holding one or more articles to be processed,
    a rigid base supporting the holder,
    a liner adapted to surround said holder and said one or more articles to be processed,
    wherein the liner is substantially impervious;
    said rigid base and holder being adapted to be retractable from said liner into a clean environment whereby said articles can be processed without contamination;
    wherein said linear is subjected, in said processing equipment, to ambient air on the exterior and to a gas on the interior and wherein said liner is formed of a thin flexible material which changes shape under changes in air and gas pressure caused by retracting of the base and holder from the liner, whereby change in the liner shape reduces the turbulence of the gas during the retracting of the base and holder.

18. The container of claim 17 wherein said liner includes a base liner located on said base and a tent liner formed in a concave shape so as to form an interior space surrounding said holder and one or more articles to be processed, said base liner and said tent liner having means engageable to form a seal to prevent contamination from transferring into said interior space.

19. The container of claim 18 further including a rigid box, said box having a base opening, said box receiving said tent liner internal to said box with a tent opening substantially enclosing said base opening whereby said rigid base is insertable through the box base opening and whereby said holder and one or more articles to be processed is inserted within said liner.

20. The container of claim 19 wherein said tent liner is a flexible plastic material and said container includes a means to attach said liner to the inside wall of said box.

21. The container of claim 18 wherein said tent liner is a semi-rigid material which maintains a concave shape surrounding the holder independently of any additional mechanical support.

22. The container of claim 17 wherein said tent liner is formed of a polystyrene and fluoroplastic lamination.

23. The container of claim 17 wherein said tent liner is formed of fluoroplastic.

24. The container of claim 17 wherein said tent liner has a surface and is formed of an electret having positive and negative charge centers distributed over said surface.

25. The container of claim 17 wherein said tent liner is conductive and is electrically connected to a conductive charge sink whereby static charges on said tent liner tend to be dissipated.

26. The container of claim 25 wherein said tent liner includes a wire mesh to render said tent liner conductive.

27. The container of claim 17 wherein said tent liner is formed of transparent material whereby articles can be observed through said tent liner.

28. The container of claim 27 wherein said tent liner is formed of a radiation filter material which excludes radiation of unwanted frequencies.

29. The container of claim 28 wherein said filter is a yellow filter for excluding ultraviolet radiation.

* * * * *